United States Patent
Pattanayak et al.

(10) Patent No.: US 9,306,056 B2
(45) Date of Patent: Apr. 5, 2016

(54) SEMICONDUCTOR DEVICE WITH TRENCH-LIKE FEED-THROUGHS

(75) Inventors: Deva Pattanayak, Saratoga, CA (US); King Owyang, Atherton, CA (US); Mohammed Kasem, Santa Clara, CA (US); Kyle Terrill, Santa Clara, CA (US); Reuven Katraro, Rishon Lezion (IL); Kuo-In Chen, Los Altos, CA (US); Calvin Choi, San Jose, CA (US); Qufei Chen, San Jose, CA (US); Ronald Wong, Millbrae, CA (US); Kam Hong Lui, Santa Clara, CA (US); Robert Xu, Fremont, CA (US)

(73) Assignee: Vishay-Siliconix, Santa Clara, CA (US)

( * ) Notice: Subject to any disclaimer, the term of this patent is extended or adjusted under 35 U.S.C. 154(b) by 918 days.

(21) Appl. No.: 12/610,148

(22) Filed: Oct. 30, 2009

(65) Prior Publication Data

US 2011/0101525 A1    May 5, 2011

(51) Int. Cl.
*H01L 23/48* (2006.01)
*H01L 29/78* (2006.01)
*H01L 23/00* (2006.01)
(Continued)

(52) U.S. Cl.
CPC ............ *H01L 29/7809* (2013.01); *H01L 24/05* (2013.01); *H01L 24/06* (2013.01); *H01L 24/11* (2013.01); *H01L 24/14* (2013.01); *H01L 29/41766* (2013.01); *H01L 29/66734* (2013.01); *H01L 29/7813* (2013.01); *H01L 29/456* (2013.01); *H01L 2224/0401* (2013.01); *H01L 2224/05* (2013.01); *H01L 2224/05552* (2013.01); *H01L 2224/05554* (2013.01); *H01L 2224/06051* (2013.01); *H01L 2224/13099* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01033* (2013.01); *H01L 2924/01047* (2013.01);
(Continued)

(58) Field of Classification Search
CPC ................. H01L 2924/00014; H01L 2924/00; H01L 2224/48247; H01L 2924/13091; H01L 29/7813; H01L 29/7811; H01L 29/0696; H01L 29/66734
USPC .......................................... 438/270; 257/330
See application file for complete search history.

(56) References Cited

U.S. PATENT DOCUMENTS 4,642,674 A    2/1987    Schoofs
4,663,644 A    5/1987    Shimizu
(Continued)

FOREIGN PATENT DOCUMENTS

CN    1401141    3/2003
CN    101276838    10/2008
(Continued)

OTHER PUBLICATIONS

Application As Filed; U.S. Appl. No. 12/107,738; Deva N. Pattanayak.
(Continued)

*Primary Examiner* — David Vu
*Assistant Examiner* — Jonathan Han

(57) ABSTRACT

A semiconductor device (e.g., a flip chip) includes a substrate layer that is separated from a drain contact by an intervening layer. Trench-like feed-through elements that pass through the intervening layer are used to electrically connect the drain contact and the substrate layer when the device is operated.

21 Claims, 7 Drawing Sheets

(51) Int. Cl.
*H01L 29/417* (2006.01)
*H01L 29/66* (2006.01)
*H01L 29/45* (2006.01)

(52) U.S. Cl.
CPC ............. *H01L 2924/01082* (2013.01); *H01L 2924/1306* (2013.01); *H01L 2924/13091* (2013.01)

(56) References Cited

U.S. PATENT DOCUMENTS

| | | |
|---|---|---|
| 4,680,604 A | 7/1987 | Nakagawa et al. |
| 4,760,431 A | 7/1988 | Nakagawa et al. |
| 4,774,198 A | 9/1988 | Contiero et al. |
| 4,775,879 A | 10/1988 | Robb et al. |
| 4,777,521 A | 10/1988 | Coe |
| 4,779,123 A | 10/1988 | Bencuya et al. |
| 4,837,606 A | 6/1989 | Goodman et al. |
| 4,916,085 A | 4/1990 | Frisina |
| 5,136,349 A | 8/1992 | Yilmaz et al. |
| 5,326,711 A | 7/1994 | Malhi |
| 5,473,176 A | 12/1995 | Kakumoto |
| 5,539,255 A | 7/1996 | Cronin |
| 5,648,283 A | 7/1997 | Tsang et al. |
| 5,742,076 A | 4/1998 | Sridevan et al. |
| 5,760,440 A | 6/1998 | Kitamura et al. |
| 5,770,514 A | 6/1998 | Matsuda et al. |
| 5,866,931 A | 2/1999 | Bulucea et al. |
| 5,869,357 A | 2/1999 | Zambrano |
| 5,899,738 A | 5/1999 | Wu et al. |
| 5,929,481 A | 7/1999 | Hshieh et al. |
| 5,998,833 A | 12/1999 | Baliga |
| 6,016,008 A | 1/2000 | Feldner |
| 6,049,108 A | 4/2000 | Williams et al. |
| 6,057,558 A | 5/2000 | Yamamoto et al. |
| 6,133,587 A | 10/2000 | Takeuchi et al. |
| 6,175,154 B1 | 1/2001 | Gillespie |
| 6,184,120 B1 | 2/2001 | Tsuchiya |
| 6,211,018 B1 | 4/2001 | Nam et al. |
| 6,246,090 B1 | 6/2001 | Brush et al. |
| 6,319,777 B1 | 11/2001 | Hueting et al. |
| 6,326,270 B1 | 12/2001 | Lee et al. |
| 6,329,282 B1 | 12/2001 | Hsu et al. |
| 6,346,438 B1 | 2/2002 | Yagishita et al. |
| 6,407,435 B1 | 6/2002 | Ma et al. |
| 6,413,822 B2 | 7/2002 | Williams et al. |
| 6,436,827 B1 | 8/2002 | Yamazaki et al. |
| 6,476,456 B1 | 11/2002 | Boden, Jr. |
| 6,511,885 B2 | 1/2003 | Harada et al. |
| 6,528,848 B1 | 3/2003 | Hoshino et al. |
| 6,552,389 B2 | 4/2003 | Yasuhara et al. |
| 6,566,718 B2 | 5/2003 | Wieczorek et al. |
| 6,627,950 B1 | 9/2003 | Bulucea et al. |
| 6,649,975 B2 | 11/2003 | Baliga |
| 6,737,704 B1 | 5/2004 | Takemori et al. |
| 6,764,889 B2 | 7/2004 | Baliga |
| 6,797,588 B2 | 9/2004 | Ishikawa et al. |
| 6,838,730 B1 | 1/2005 | Kawaguchi et al. |
| 6,872,668 B1 | 3/2005 | Cao et al. |
| 6,888,196 B2 | 5/2005 | Kobayashi |
| 6,891,223 B2 | 5/2005 | Krumrey et al. |
| 6,906,380 B1 | 6/2005 | Pattanayak et al. |
| 6,919,248 B2 | 7/2005 | Francis et al. |
| 6,974,750 B2 | 12/2005 | Haase |
| 7,008,871 B2 | 3/2006 | Andricacos et al. |
| 7,061,057 B2 | 6/2006 | Babcock et al. |
| 7,186,609 B2 | 3/2007 | Korec et al. |
| 7,235,845 B2 | 6/2007 | Xu et al. |
| 7,279,743 B2 | 10/2007 | Pattanayak et al. |
| 7,282,765 B2 | 10/2007 | Xu et al. |
| 7,344,945 B1 | 3/2008 | Pattanayak et al. |
| 7,361,558 B2 | 4/2008 | Pattanayak et al. |
| 7,576,388 B1 | 8/2009 | Wilson et al. |
| 7,833,863 B1 | 11/2010 | Pattanayak et al. |
| 7,952,145 B2 | 5/2011 | Korec et al. |
| 8,183,629 B2 | 5/2012 | Pattanayak et al. |
| 8,368,126 B2 | 2/2013 | Pattanayak et al. |
| 8,471,390 B2 | 6/2013 | Wong et al. |
| 8,604,525 B2 | 12/2013 | Terrill |
| 8,697,571 B2 | 4/2014 | Wong et al. |
| 9,064,896 B2 | 6/2015 | Terrill |
| 2001/0003367 A1 | 6/2001 | Hshieh et al. |
| 2001/0023959 A1 | 9/2001 | Harada et al. |
| 2002/0019099 A1 | 2/2002 | Williams et al. |
| 2002/0056862 A1 | 5/2002 | Miki et al. |
| 2002/0076924 A1 | 6/2002 | Koo |
| 2002/0125528 A1 | 9/2002 | Kawaguchi et al. |
| 2003/0001203 A1 | 1/2003 | Ono et al. |
| 2003/0006456 A1 | 1/2003 | Takahashi et al. |
| 2003/0008460 A1 | 1/2003 | Darwish |
| 2003/0062570 A1 | 4/2003 | Darwish et al. |
| 2003/0062622 A1 | 4/2003 | Pavier et al. |
| 2003/0137054 A1 | 7/2003 | Ishihara |
| 2003/0178673 A1 | 9/2003 | Bhalla et al. |
| 2004/0005783 A1 | 1/2004 | Lee |
| 2004/0108554 A1 | 6/2004 | Hshieh et al. |
| 2004/0195618 A1 | 10/2004 | Saito et al. |
| 2005/0017298 A1 | 1/2005 | Xie et al. |
| 2005/0093097 A1 | 5/2005 | Baiocchi et al. |
| 2005/0158990 A1 | 7/2005 | Park et al. |
| 2005/0167748 A1 | 8/2005 | Onda et al. |
| 2005/0199918 A1 | 9/2005 | Calafut et al. |
| 2005/0280085 A1 | 12/2005 | Babcock et al. |
| 2005/0287744 A1 | 12/2005 | Ono et al. |
| 2006/0220124 A1 | 10/2006 | Ohtake |
| 2006/0273380 A1 | 12/2006 | Hshieh |
| 2006/0273390 A1 | 12/2006 | Hshieh et al. |
| 2007/0013008 A1 | 1/2007 | Xu et al. |
| 2007/0034944 A1 | 2/2007 | Xu et al. |
| 2007/0114599 A1 | 5/2007 | Hshieh |
| 2007/0132017 A1 | 6/2007 | Oikawa |
| 2007/0243671 A1 | 10/2007 | Liaw |
| 2008/0135872 A1 | 6/2008 | Chen et al. |
| 2008/0142883 A1* | 6/2008 | Grebs et al. ................ 257/334 |
| 2008/0197411 A1 | 8/2008 | Korec et al. |
| 2008/0237852 A1 | 10/2008 | Yoshida et al. |
| 2008/0265289 A1 | 10/2008 | Bhalla et al. |
| 2008/0265314 A1 | 10/2008 | Kobayashi |
| 2009/0079002 A1 | 3/2009 | Lee et al. |
| 2009/0315175 A1 | 12/2009 | Okada et al. |

FOREIGN PATENT DOCUMENTS

| | | |
|---|---|---|
| DE | 10239310 | 3/2004 |
| EP | 0133642 | 3/1985 |
| EP | 1170803 | 1/2001 |
| EP | 1793426 A2 | 6/2007 |
| JP | 64769 | 2/1888 |
| JP | 57206073 | 12/1982 |
| JP | 62039069 | 2/1987 |
| JP | 63252480 | 4/1987 |
| JP | 7153841 | 6/1995 |
| JP | 8017925 | 1/1996 |
| JP | 2001094094 | 4/2001 |
| JP | 2003505864 | 2/2003 |
| JP | 2003289075 | 10/2003 |
| JP | 2003318396 | 11/2003 |
| JP | 2004502293 A | 1/2004 |
| JP | 2005243664 | 9/2005 |
| JP | 2006012967 | 1/2006 |
| JP | 2006074054 | 3/2006 |
| JP | 2007142272 | 6/2007 |
| JP | 2007142272 A * | 6/2007 |
| JP | 2007-184553 | 7/2007 |
| JP | 2009-505403 | 2/2009 |
| WO | 01/59842 A1 | 8/2001 |
| WO | 03/096428 A1 | 11/2003 |

(56) References Cited

FOREIGN PATENT DOCUMENTS

| WO | 2006017376 | 2/2006 |
|---|---|---|
| WO | 2007021701 | 2/2007 |
| WO | 2008/126914 A1 | 10/2008 |

OTHER PUBLICATIONS

Application As Filed; U.S. Appl. No. 12/050,929; Deva N. Pattanayak.

Application As Filed; U.S. Appl. No. 12/098,950; Deva N. Pattanayak.

Application As Filed; U.S. Appl. No. 60/925,237; Deva N. Pattanayak.

H. Yilmaz et al., Insulated gate Transistor Modeling and Optimizatio, 1984, pp. 274-277 IEDM.

H. Yilmaz, Cell Geometry Effect on IGT Latch-Up, IEEE Electron Device Letters, vol. EDL-6, No. 8, Aug. 1985.

Victor A.K. Temple, MOS-Controlled Thyristors—A New Class of Power Devices, Oct. 1986. pp. 1609-1618, IEEE, vol. ED-33, No. 10.

\* cited by examiner

SEMICONDUCTOR DEVICE WITH TRENCH-LIKE FEED-THROUGHS

FIELD OF THE INVENTION

Embodiments in accordance with the present invention generally pertain to semiconductor devices.

BACKGROUND

A "flip chip" is a semiconductor device that includes a pattern of solder balls arrayed on one of the chip's surfaces. During fabrication, the solder balls are formed on the top surface of the chip. The chip can then be readily mounted onto, for example, a circuit board by flipping the chip so that the top surface faces downward and the solder balls are aligned with corresponding pads on the circuit board.

In a non-flip chip semiconductor device, the gate and source contacts are on one surface (e.g., the top surface) of the chip while the drain contact is on the opposite surface (e.g., the bottom surface) of the chip. In a flip chip, the gate, source, and drain contacts are on the same surface of the chip. To form a circuit between the source and drain in a conventional flip chip, a "diffusion sinker" or "deep sinker" 110 is formed in the epitaxial layer 150 between the drain 120 and the substrate layer 130 as shown in FIG. 1. In operation, current will flow from the source 140 to, and through, the substrate and then to the drain in a known manner.

The sinker is formed using an isotropic diffusion process in which a dopant material is diffused through the epitaxial layer until the sinker is in contact with the substrate. However, as the sinker diffuses downward (in the y-direction), it also diffuses both along the surface of the structure (in the x-direction) and into the higher resistivity epitaxial layer. Thus, the surface area of the sinker is relatively large, increasing the size of each cell and thereby decreasing cell density. Also, the resistance of the epitaxial layer increases as the size of the sinker increases, thereby increasing the device's on-resistance (Rdson). Furthermore, the isotropic diffusion process is relatively slow, which increases the time needed to manufacture the flip chips and decreases throughput, thereby increasing costs.

SUMMARY

Embodiments according to the present invention provide solutions to the problems associated with sinkers. In one embodiment, relatively deep trenches filled with a conductive material such as tungsten are used to connect the drain contact to the substrate. Compared to a conventional sinker, the trenches—also referred to herein as "feed-throughs"—occupy less surface area and result in lower parasitic resistance in the epitaxial layer. There are also efficiencies associated with the fabrication of the feed-throughs, thus increasing throughput and reducing costs. These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1:
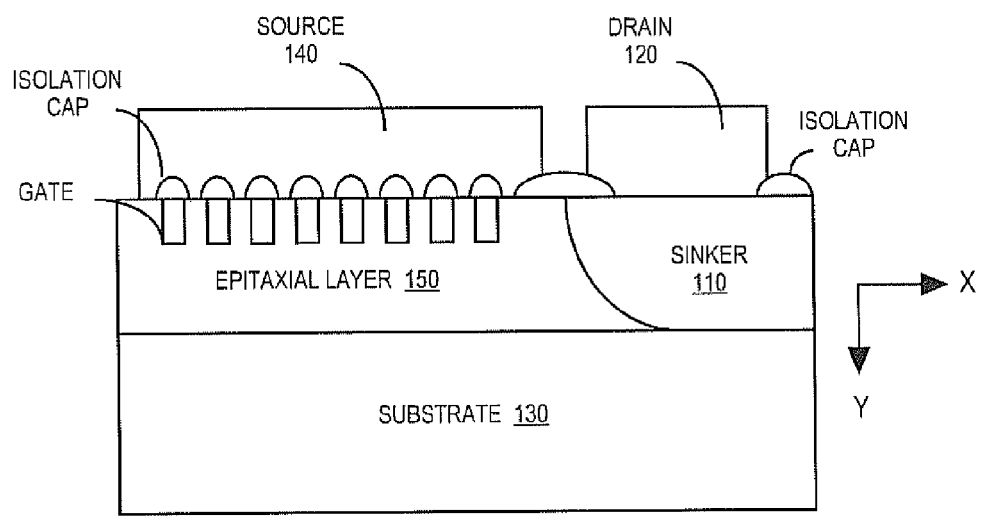
FIG. 1 is a cross-sectional view showing elements of a conventional semiconductor device.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes (e.g., flowchart 600 of FIG. 6) of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) structures, processes and steps without significantly perturbing them. Generally speaking, embodiments in accordance with the present invention can replace portions of a conventional device or process without significantly affecting peripheral structures, processes and steps.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a field effect transistor (FET) in a channel, from the source connection to the drain connection. A channel can be made of either n-type or p-type semiconductor material; accordingly, a FET is specified as either an n-channel or a p-channel device.

FIGS. 2-6 are discussed in the context of a p-channel device, specifically a p-channel power MOSFET (metal oxide semiconductor FET) embodied as a flip chip; however, embodiments according to the present invention are not so limited. That is, the features described herein can be utilized in an n-channel device. The discussion of FIGS. 2-6 can be readily mapped to an n-channel device by substituting n-type dopant and materials for corresponding p-type dopant and materials, and vice versa.

Figure 2:
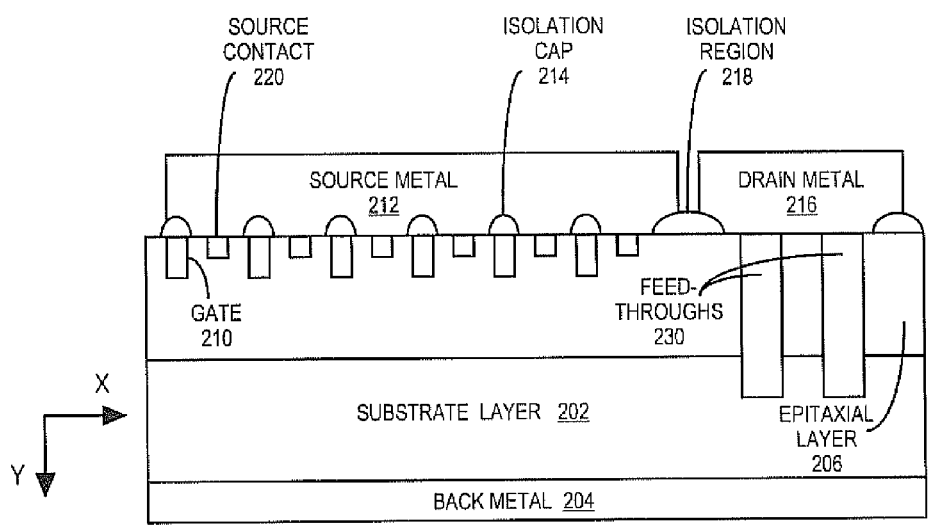
FIG. 2 is a cross-sectional view showing elements of a semiconductor device according to embodiments of the present invention.

FIG. 2 is a cross-sectional view showing a portion of a semiconductor device 200 (e.g., a flip chip) according to an embodiment of the present invention. The device 200 includes a conductive (e.g., p+ or p++) substrate layer 202. In one embodiment, there is a back metal layer 204 adjacent to the substrate layer 202. The device also includes one or more additional layers exemplified by epitaxial layer 206, which may also be referred to herein as an intervening layer. The epitaxial layer 206 may include additional structures, layers or regions not shown in FIG. 2. For example, the epitaxial layer 206 may include isolation layers and regions; junction and channel (inversion) layers and regions; body regions; etc. These structures, layers and regions are known in the art but are not illustrated here for simplicity.

A number of trench or trench-like polysilicon gates 210 are formed in the epitaxial layer 206; the gates 210 extend only partially into the epitaxial layer. Isolation caps (e.g., silicon dioxide, $SiO_2$) 214 insulate the gates 210 from an overlying source metal 212 (e.g., aluminum) patterned on the epitaxial layer 206. Between the gates 210 are a number of trench or trench-like source contacts 220; the contacts 220 extend only partially into the epitaxial layer 206. Drain metal 216 (e.g., aluminum) is also patterned on the epitaxial layer 206 as shown in FIG. 2, and is isolated from the source metal 212 by an isolation region (e.g., $SiO_2$) 218. In one embodiment, the source metal 212 and the drain metal 216 are connected to respective solder balls (not shown in FIG. 2; refer to FIG. 3A).

Continuing with reference to FIG. 2, a number of trench or trench-like elements 230, also referred to herein as feed-throughs, are formed in the epitaxial layer 206. The feed-throughs 230 extend completely through the epitaxial layer 206, making contact with and perhaps extending into the substrate layer 202. The feed-throughs 230 provide an electrical connection between the drain metal 216 and the substrate layer 202.

In comparison to a conventional sinker, both the area and the volume consumed by the feed-throughs 230 are substantially reduced. Thus, the size of each cell can be reduced, thereby increasing cell density and/or reducing device size, an important consideration when the flip chip is used in mobile/hand-held devices such as cell phones and smart phones. Also, relative to a sinker, the feed-throughs 230 reduce the resistance of the epitaxial layer 206, thereby decreasing the on-resistance (Rdson) of the device 200. Furthermore, the feed-throughs 230 can be fabricated more quickly than a sinker, decreasing the time needed to manufacture the flip chips and increasing throughput, thereby decreasing costs.

In one embodiment, the feed-throughs 230 and the source contacts 220 are made of the same filler material. In one such embodiment, the feed-throughs 230 and the source contacts 220 are made of tungsten. Tungsten is chosen because its thermal coefficient is a better match with silicon than that of doped silicon, and because it has intrinsically lower resistance than doped silicon. Using the same material to fill the feed-through trenches and the source contact trenches facilitates fabrication, as will be described further below.

In one embodiment, the trenches for the feed-throughs 230 and the trenches for the source contacts 220 are each lined with the same liner material prior to deposition of the filler material, to prevent the filler material from contacting the surrounding silicon. In one such embodiment, the trenches are lined with a conformal coating of titanium (Ti) and Ti-nitride (TiN). In one embodiment, the Ti coating has a thickness of approximately 600 Angstroms, and the TiN coating has a thickness of approximately 200 Angstroms. Using the same material to line the feed-through trenches and the source contact trenches facilitates fabrication, as will be described further below.

The device 200 operates in a known manner, except that the feed-throughs 230 provide the functionality previously provided by a conventional sinker. By applying an electrical potential to a gate 210, a circuit will be completed, with current flowing from the source metal 212 through the source contacts 220 into structures (not shown) in the epitaxial layer 206, through the substrate layer 202, and then to the drain metal 216 via the feed-throughs 230.

Figure 3A:
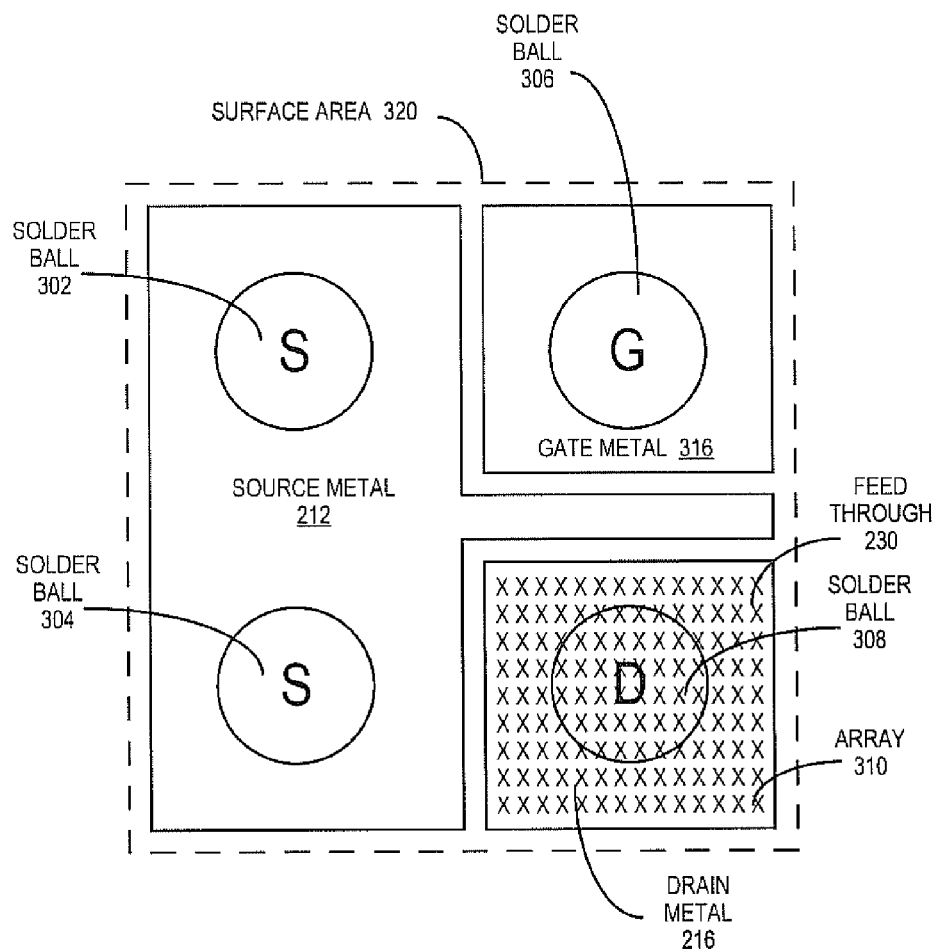
FIG. 3A illustrates a top-down view of a portion of a semiconductor device in one embodiment according to the present invention.

FIG. 3A illustrates a top-down (layout) view of a portion of the semiconductor device 200 (e.g., a flip chip) according to one embodiment of the present invention. In the example of FIG. 3, two solder balls 302 and 304 are in contact with the source metal 212, a solder ball 306 is in contact with the gate metal 316, and a solder ball 308 is in contact with the drain metal 216. Underlying the drain metal 216 is an array 310 of feed-throughs 230, shown in cross-section in FIG. 2. Thus, the drain metal 216 is formed over and connected with multiple feed-throughs 230, and the solder ball 308 is formed on the drain metal 216.

Figure 3B:
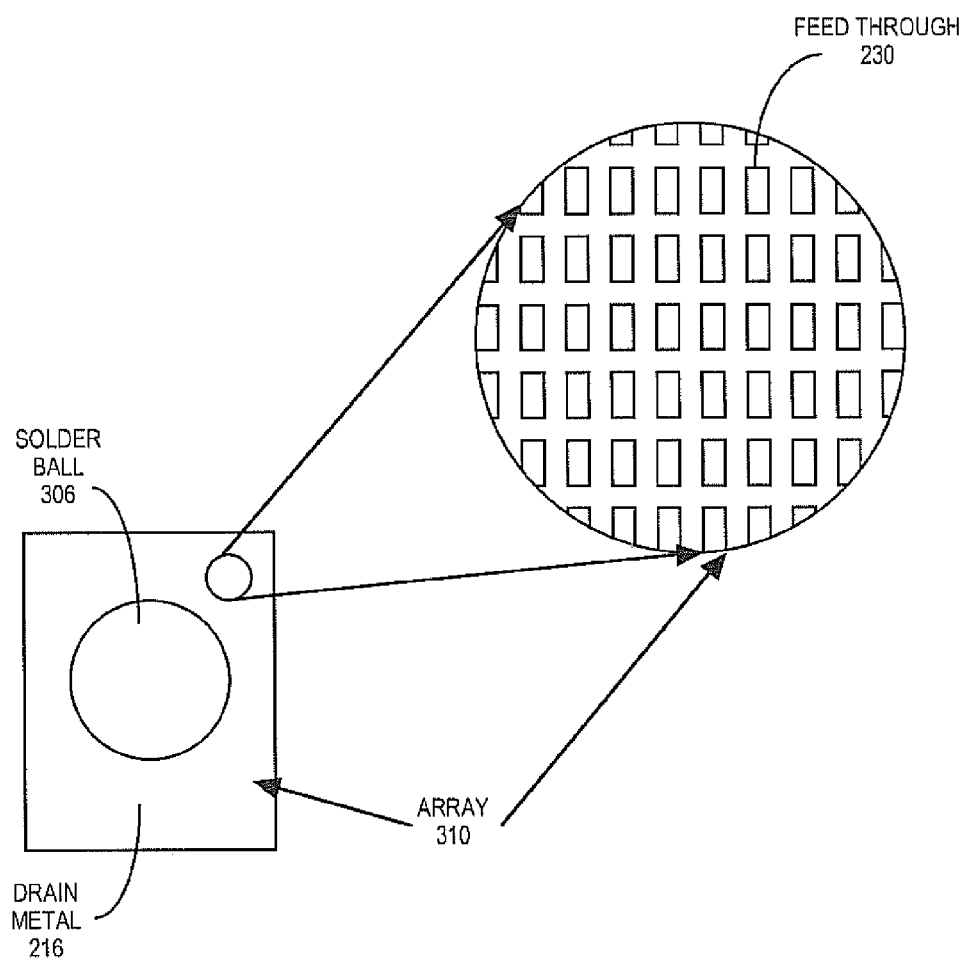
FIG. 3B illustrates a portion of a feed-through array in an embodiment according to the present invention.

FIG. 3B represents a portion of the feed-through array 310. There can be many feed-throughs 230 situated within (underneath) the region of drain metal 216 and consequently under (and connected to) the solder ball 308. Because many feed-throughs 230 are included in the array 310, a large current can flow through the feed-throughs without causing an electromigration problem. In particular, the dimensions of each feed-through in the array are chosen so that the electromigration threshold is high.

Significantly, with reference back to FIG. 3A, the surface area 320 that encompasses the source metal 212, gate metal 316, and drain metal 216 corresponds to the amount of surface area consumed by a conventional diffusion or deep sinker. In other words, the amount of surface area needed to accommodate the array 310 of feed-throughs 230 is substantially less than the area consumed by a sinker. Thus, as alluded to above, the use of the feed-throughs 230 in place of a sinker frees up real estate in the chip that can be used for additional structures such as those shown in FIG. 3A. By using feed-throughs instead of sinkers, a device of a given size can include more cells; conversely, for a given number of cells, the size of a power MOSFET flip chip can be reduced.

Figure 4:
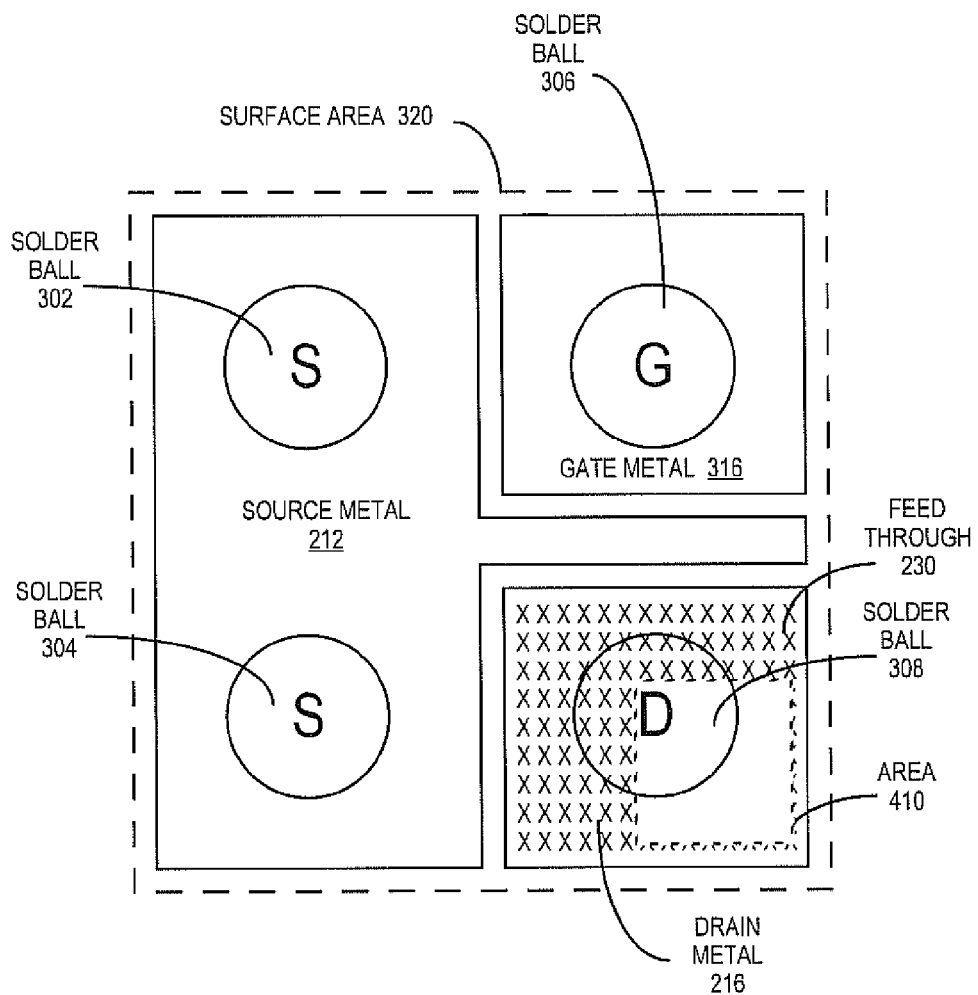
FIG. 4 illustrates an example of an arrangement of feed-throughs in an embodiment according to the present invention.

FIG. 4 shows an example of an arrangement of feed-throughs 230 in which the feed-throughs are concentrated under only a portion of the region of drain metal 216. Specifically, in the example of FIG. 4, the feed-throughs 230 are concentrated toward the direction from which the current is flowing—that is, toward the source region. Consequently, feed-throughs are not included in the area 410 of the drain region, further reducing the resistance of the epitaxial layer 206 (FIG. 2), and further reducing the amount of surface area utilized for the feed-throughs. Thus, the area 410 can be used for other structures, for example, to increase cell density.

Figure 5:
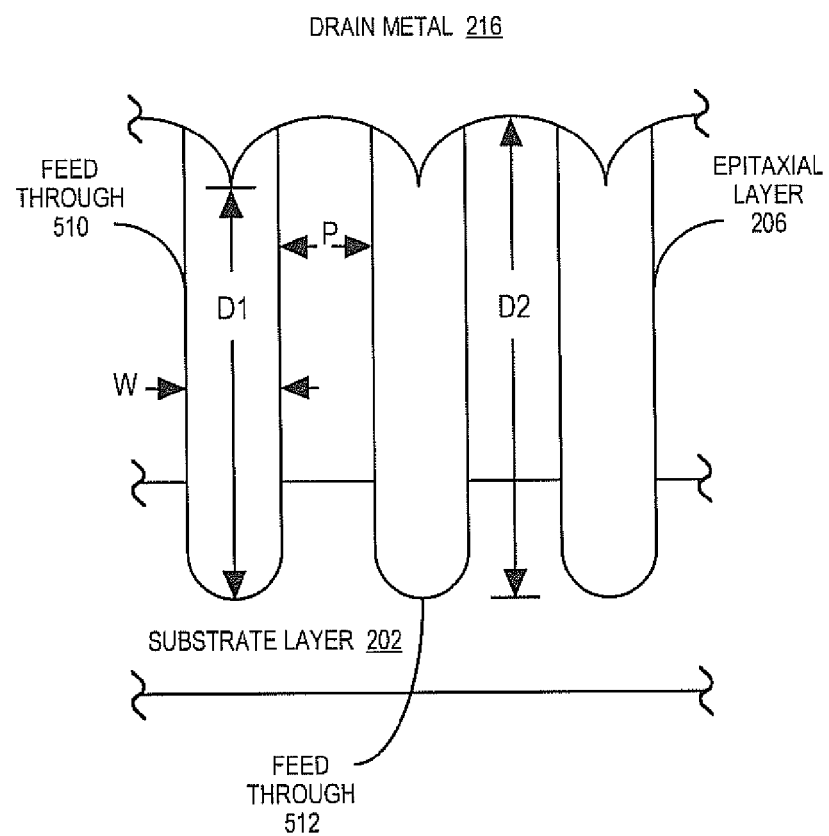
FIG. 5 is a cross-sectional view of feed-throughs showing selected dimensions in one embodiment according to the present invention.

FIG. 5 is a cross-sectional view of tungsten feed-throughs 510 and 512 showing selected dimensions. In the example of FIG. 5, the feed-throughs 510 and 512 each have a width W of about 0.9 microns (more precisely, 0.95 microns); a depth D1 of about 8.7 microns (more precisely, 8.73 microns) measured at the shortest (shallowest) point (along the centerline) and a depth D2 of about 9.3 microns (more precisely, 9.31 microns) measured at the longest (deepest) point; and a distance (pitch P) between adjacent feed-throughs of about 1.7 microns (more precisely, 1.74 microns). With these dimensions, the resistance of an array of tungsten feed-throughs is about one-half of the resistance associated with a conventional sinker.

Figure 6:
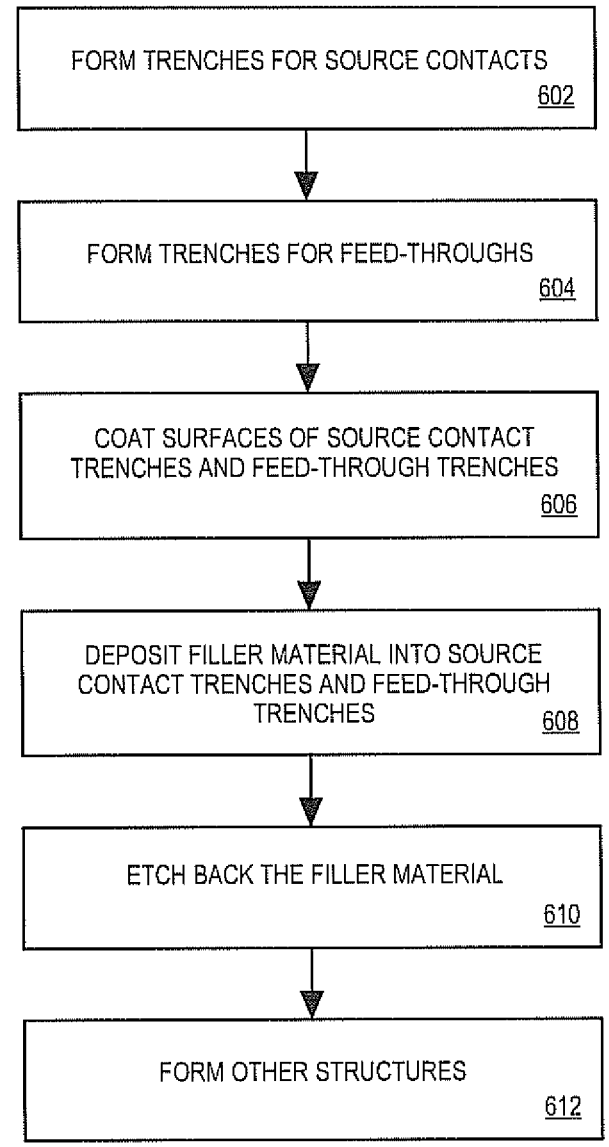
FIG. 6 is a flowchart of a process that is used in the fabrication of a semiconductor device according to embodiments of the present invention.

FIG. 6 illustrates a flowchart 600 of one embodiment of a process that is used in the fabrication of semiconductor devices such as the device 200 of FIG. 2. Although specific steps are disclosed in FIG. 6, such steps are only examples. That is, embodiments according to the present invention are well suited to performing various other steps or variations of the steps recited in FIG. 6. As noted above, the epitaxial layer 206 (FIG. 2) may include structures, layers, and regions not shown in the figures—those structures, layers, and regions can be formed before, during (e.g., as part of), and/or after the steps in flowchart 600 are performed.

In block 602 of FIG. 6, with reference also to FIG. 2, a first mask, with openings corresponding to the locations of the source contacts 220, is applied to the upper surface of the epitaxial layer 206. The trenches for the source contacts are etched through those openings, and then the first mask is removed. The trenches for the source contacts extend partially into but not completely through the epitaxial layer 206.

In block 604, a second mask, with openings corresponding to the locations of the feed-throughs 230, is applied to the upper surface of the epitaxial layer 206. The trenches for the feed-throughs are etched through those openings, and then the second mask is removed. The trenches for the feed-throughs extend completely through the epitaxial layer 206 and into the substrate layer 202.

In block 606, a conformal coating is applied to the surfaces of the source contact trenches and to the surfaces of the feed-through trenches. In one embodiment, the conformal coating is applied to the surfaces of the source contact trenches and feed-through trenches in the same process step. In one such embodiment, the same material (e.g., Ti and TiN) is used to coat the surfaces of the source contact trenches and the feed-through trenches.

In block 608, a filler material (e.g., tungsten) is deposited into the source contact trenches and into the feed-through trenches. In one embodiment, the filler material is deposited into the source contact trenches and the feed-through trenches in the same process step.

In block 610, the filler material is etched back so that is flush, or nearly flush, with the upper surface of the epitaxial layer 206.

In block 612, other structures can be formed. For example, aluminum metal can be deposited and patterned to form source, drain, and gate regions. Subsequently, solder balls are positioned on the source, drain, and gate regions.

In comparison to a conventional process, the steps of i) applying the mask associated with the feed-through trenches and ii) forming the feed-through trenches are added, but the conventional steps of i) applying a mask to form a sinker and ii) forming the sinker are eliminated. Because, in one embodiment, the feed-through trenches are coated and filled at the same time that the source contact trenches are coated and filled, those steps do not lengthen the fabrication process by a significant amount, if at all. The feed-throughs 230 take less time to fabricate relative to the time needed to form a conventional sinker. Consequently, in total, the introduction of the feed-throughs shortens the length of the fabrication process, increasing throughput and decreasing cost.

Also, as mentioned above, the feed-throughs occupy less surface area and result in lower parasitic resistance in the epitaxial layer in comparison to conventional sinkers. Consequently, the size of each cell can be decreased, thereby increasing cell density. Moreover, the device's on-resistance is reduced.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device comprising:
   an electrically conductive substrate layer;
   a drain contact, wherein said substrate layer is separated from said drain contact by an intervening layer;
   a plurality of gate trenches that extend into but not completely through said intervening layer, each of said gate trenches filled with a first filler material;
   a plurality of source contact trenches that extend into but not completely through said intervening layer, each of said source contact trenches filled with a second filler material different from said first filler material, wherein said source contact trenches are interleaved between said gate trenches; and
   a plurality of feed-through trenches that extend completely through said intervening layer to said substrate layer, each of said feed-through trenches filled with said second filler material and coupled to said drain contact, wherein said feed-through trenches are adjacent to each other under said drain contact and are not interleaved with said gate trenches and are not interleaved with said source contact trenches.

2. The semiconductor device of claim 1 wherein said first filler material comprises polysilicon and said second filler material comprises tungsten.

3. The semiconductor device of claim 1 wherein said feed-through trenches are each lined with a conformal coating that separates said second filler material from said intervening layer.

4. The semiconductor device of claim 3 wherein said conformal coating comprises material selected from the group consisting of: titanium and titanium-nitride.

5. The semiconductor device of claim 3 wherein said conformal coating comprises a thickness of titanium of about 600 Angstroms and a thickness of titanium-nitride of about 200 Angstroms.

6. The semiconductor device of claim 1 wherein said device comprises a flip chip having a plurality of solder balls formed on a surface thereof, wherein said drain contact is coupled to at least one of said solder balls.

7. The semiconductor device of claim 1 wherein said feed-through trenches are non-uniformly distributed under said drain contact between said drain contact and said substrate layer, wherein said feed-through trenches are concentrated toward a source region of said device.

8. The semiconductor device of claim 1 wherein each trench in said plurality of feed-through trenches has a depth of approximately 8.7 microns at their shallowest points, a width of approximately 0.9 microns, and a pitch of approximately 1.7 microns.

9. The semiconductor device of claim 1 wherein said feed-through trenches are non-uniformly distributed under a solder ball coupled to said drain contact.

10. A flip chip semiconductor device comprising:
a plurality of solder balls comprising a solder ball coupled to a drain contact on a first surface of said device;
a first metal layer on a second surface of said device, said second surface opposite said first surface;
a substrate layer adjacent said first metal layer, wherein said substrate layer is separated from said drain contact by an intervening layer;
a plurality of gate trenches that extend into but not completely through said intervening layer, each of said gate trenches filled with a first filler material;
a plurality of source contact trenches that extend into but not completely through said intervening layer, each of said source contact trenches filled with a second filler material different from said first filler material, wherein said source contact trenches are interleaved between said gate trenches, and wherein said source contact trenches are in contact with a second metal layer but said gate trenches are isolated from said second metal layer; and
a plurality of feed-through trenches that extend completely through said intervening layer to said substrate layer, each of said feed-through trenches with said second filler material and coupled to said drain contact, wherein said feed-through trenches pass through said intervening layer and into said substrate layer, wherein said feed-through trenches are adjacent to each other under said drain contact and are not interleaved with said gate trenches and are not interleaved with said source contact trenches, and further wherein in operation said device comprises a circuit from a source contact through said intervening layer, said substrate layer, and said feed-through trenches to said drain contact.

11. The semiconductor device of claim 10 wherein said first filler material comprises polysilicon and said second filler material comprises tungsten.

12. The semiconductor device of claim 10 wherein said source contact trenches and said feed-through trenches are each lined with a conformal coating that separates said second filler material from said intervening layer.

13. The semiconductor device of claim 12 wherein said conformal coating comprises material selected from the group consisting of: titanium and titanium-nitride.

14. The semiconductor device of claim 10 wherein said feed-through trenches are non-uniformly distributed under said drain contact between said drain contact and said substrate layer, wherein a greater concentration of said feed-through trenches is located toward said source contact.

15. The semiconductor device of claim 10 wherein said feed-through trenches are non-uniformly distributed under said solder ball.

16. A method of fabricating a flip chip, said method comprising:
forming a plurality of gate trenches in a surface of an epitaxial layer of a structure, said gate trenches extending partially into but not completely through said epitaxial layer, wherein a first plurality of source contact trenches are also formed in said surface of said epitaxial layer, said source gate trenches extending partially into but not completely through said epitaxial layer, said source contact trenches interleaved between said gate trenches;
forming a plurality of feed-through trenches in said surface, said feed-through trenches extending completely through said epitaxial layer and into a substrate layer adjoining a second surface of said epitaxial layer; and
depositing a first filler material into said source contact trenches and depositing a second filler material into both said gate trenches and said feed-through trenches, said second filler material different from said first filler material, wherein said gate trenches are subsequently electrically coupled to a first solder ball used as a source contact, wherein said feed-through trenches are adjacent to each other under a drain contact and are not interleaved with said gate trenches and are not interleaved with said source contact trenches, and wherein said feed-through trenches are subsequently electrically coupled to a second solder ball used as a drain contact.

17. The method of claim 16 wherein said first filler material comprises polysilicon and said second filler material comprises tungsten.

18. The method of claim 16 further comprising, in a same process step performed after said gate trenches and said feed-through trenches are formed and before said second filler material is deposited, depositing a conformal coating that lines said gate trenches and that lines said feed-through trenches.

19. The method of claim 18 wherein said conformal coating comprises material selected from the group consisting of: titanium and titanium-nitride.

20. The method of claim 16 wherein said feed-through trenches are non-uniformly distributed within said drain region under said drain contact, wherein said feed-through trenches are concentrated toward a source region of said flip chip.

21. The method of claim 16 wherein said first filler material is deposited into said source contact trenches and into said feed-through trenches in a same process step.

* * * * *